United States Patent
Sakai

[19]

[11] Patent Number: 5,929,632
[45] Date of Patent: Jul. 27, 1999

[54] APPARATUS FOR DETERMINING MAGNETIC HEAD WEAR

[75] Inventor: Seiichi Sakai, Tokyo, Japan

[73] Assignee: Sony Corporation, Tokyo, Japan

[21] Appl. No.: 08/889,098

[22] Filed: Jul. 7, 1997

[30]  Foreign Application Priority Data

Jul. 9, 1996 [JP]  Japan ..................................... 8-179349

[51] Int. Cl.$^6$ .............................. G11B 5/00; G01R 33/12; G01N 27/72
[52] U.S. Cl. ............................................ 324/210; 360/137
[58] Field of Search ...................................... 324/210, 211, 324/212, 226, 207.26, 234, 236; 360/31, 84, 110, 119, 137

[56]  References Cited

U.S. PATENT DOCUMENTS 5,729,133  3/1998  Sakai et al. .............................. 324/210

Primary Examiner—Walter E. Snow
Attorney, Agent, or Firm—Jay H. Maioli

[57]  ABSTRACT

A magnetic recording and/or reproduction apparatus which is low in load to a CPU for calculating measurement data of a projection amount of a magnetic head and is small in capacity required for a non-volatile memory for storing resulting values of calculation of the CPU includes a measurement instrument for measuring a position and a projection amount of a magnetic head held on a rotary drum, a digital circuit for converting the position and the projection amount into digital data in response to a reference signal generated for each rotation of the rotary drum, a memory for storing initial values of the position and the projection amount, and a CPU for comparing the initial values stored in the memory with the rotational position and the projection amount measured by the measurement instrument. The CPU compares the projection amount measured by the measurement instrument with the projection amount stored in the memory only when the position measured by the measurement instrument and the initial value of the position stored in the memory are equal to each other.

6 Claims, 6 Drawing Sheets

EQUIVALENT MAGNETIC CIRCUIT INCLUDING MAGNETIC GAP

CIRCUIT SYSTEM FOR MEASUREMENT OF ABRASION AMOUNT OF MAGNETIC HEAD

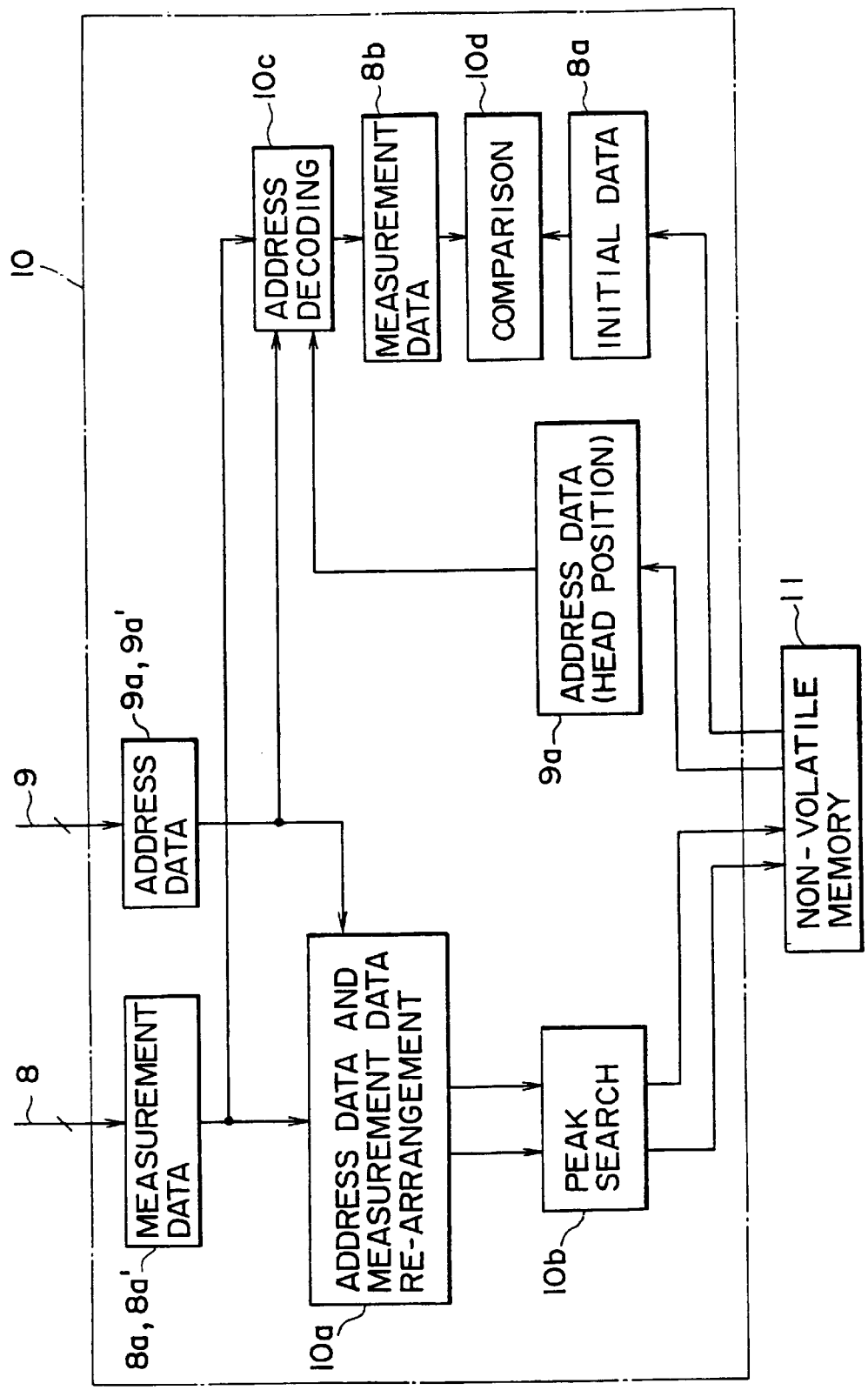

5,929,632

APPARATUS FOR DETERMINING MAGNETIC HEAD WEAR

BACKGROUND OF THE INVENTION

This invention relates to a magnetic recording and/or reproduction apparatus, and more particularly to a magnetic recording and/or reproduction apparatus which includes a measuring instrument for measuring the position and the projection amount of a magnetic head.

A magnetic head employed in a magnetic recording and/or reproduction apparatus is abraded as the time of use thereof proceeds. Particularly, a magnetic head mounted on a rotary drum of the rotary head type is abraded at a higher rate and is rather shorter in life than a magnetic head of the fixed head type since the relative speed thereof to a magnetic tape is higher than that of the latter. As the abrasion of the magnetic head proceeds, also a region which forms the magnetic head gap, that is, the head depth, decreases and the contacting characteristic thereof with a magnetic tape or the electromagnetic conversion characteristics (frequency characteristics upon recording and reproduction) thereof vary significantly. Therefore, various magnetic head abrasion amount measuring methods and apparatus wherein an abrasion amount is measured from a variation of the projection amount of a magnetic head have been proposed. Also the assignee of the present invention has proposed non-contacting magnetic head abrasion amount measuring instruments which employ a magnetic device in Japanese Patent Laid-Open Applications. Nos. Heisei 7-235235, 7-353569 and 7-235249.

The non-contacting magnetic head abrasion amount measuring instruments are generally constructed such that a pair of magnetic sensors are disposed in an opposing relationship to a magnetic head held on a rotary drum at positions outside an angular range over which a magnetic head is wrapped around the rotary drum, and a variation of the gap between the magnetic head and the magnetic sensor which is caused by abrasion of the magnetic head is converted into a variation of the reluctance. In Japanese Patent Laid-Open Application No. Heisei 7-235249, it is disclosed that address data representative of the position of the magnetic head held on the rotary drum and measurement data of the projection amount corresponding to the address data are obtained based on a reference signal from a pulse generator (PG) provided on the rotary drum.

However, since the address data of the magnetic head and the corresponding measurement data of the projection amount obtained in this manner include not only measurement data of the gap between the magnetic sensor and the magnetic head but also the measurement data of the overall gap between the magnetic sensor and the outer peripheral surface of the rotary drum, the load to a central processing unit (hereinafter referred to simply as CPU) for calculating all of the measurement data is high, and a non-volatile memory of a large capacity for storing all resulting values of the calculation is required.

SUMMARY OF THE INVENTION

It is an object of the present invention to provide a magnetic recording and/or reproduction apparatus which is low in load to a CPU for calculating measurement data of a projection amount corresponding to address data of a magnetic head and is small in capacity required for a non-volatile memory for storing resulting values of calculation of the CPU.

In order to attain the object described above, according to the present invention, there is provided a magnetic recording and/or reproduction apparatus, comprising measurement means disposed in an opposing and non-contacting relationship to and with a rotary magnetic head apparatus, on which a magnetic head is mounted, outside a range of a wrap angle over which a magnetic tape is wrapped around a rotary drum of the rotary magnetic head apparatus for measuring a rotational position of the magnetic head and a projection amount of the magnetic head at the rotational position from the rotary drum, a digital circuit for converting the rotational position and the projection amount into digital data in response to a reference signal generated for each rotation of the rotary drum, a memory for storing initial values of the rotational position and the projection amount in the form of digital data obtained by the conversion of the digital circuit, and a CPU for comparing the initial values of the rotational position and the projection amount stored in the memory with the rotational position and the projection amount measured by the measurement means, respectively, the CPU comparing the projection amount measured by the measurement means with the projection amount stored in the memory only when the rotational position measured by the measurement means and the initial value of the rotational position stored in the memory are equal to each other.

With the magnetic recording and/or reproduction apparatus, the CPU compares the projection amount measured by the measurement means with the projection amount stored in the memory only when the rotational position measured by the measurement means and the initial value of the rotational position stored in the memory are equal to each other. Consequently, the load to the CPU is reduced. Further, an inexpensive non-volatile memory of a small capacity can be used for the memory for storing results of calculation of the CPU.

Consequently, an inexpensive magnetic recording and/or reproduction apparatus which can calculate the abrasion amount of a magnetic head at a high speed can be provided.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 6 is a schematic flow chart illustrating processing of address data and measurement data of the projection amount of a magnetic head by a CPU of the magnetic recording and/or reproduction apparatus of FIG. 1.

DESCRIPTION OF THE PREFERRED EMBODIMENT

FIGS. 1 to 4 show a magnetic recording and/or reproduction apparatus to which the present invention is applied. The magnetic recording and/or reproduction apparatus is generally constructed such that a pair of magnetic heads are disposed in an opposing relationship to each other at positions spaced by an angular distance of approximately 180 degrees from each other around a rotary drum.

Figure 1:
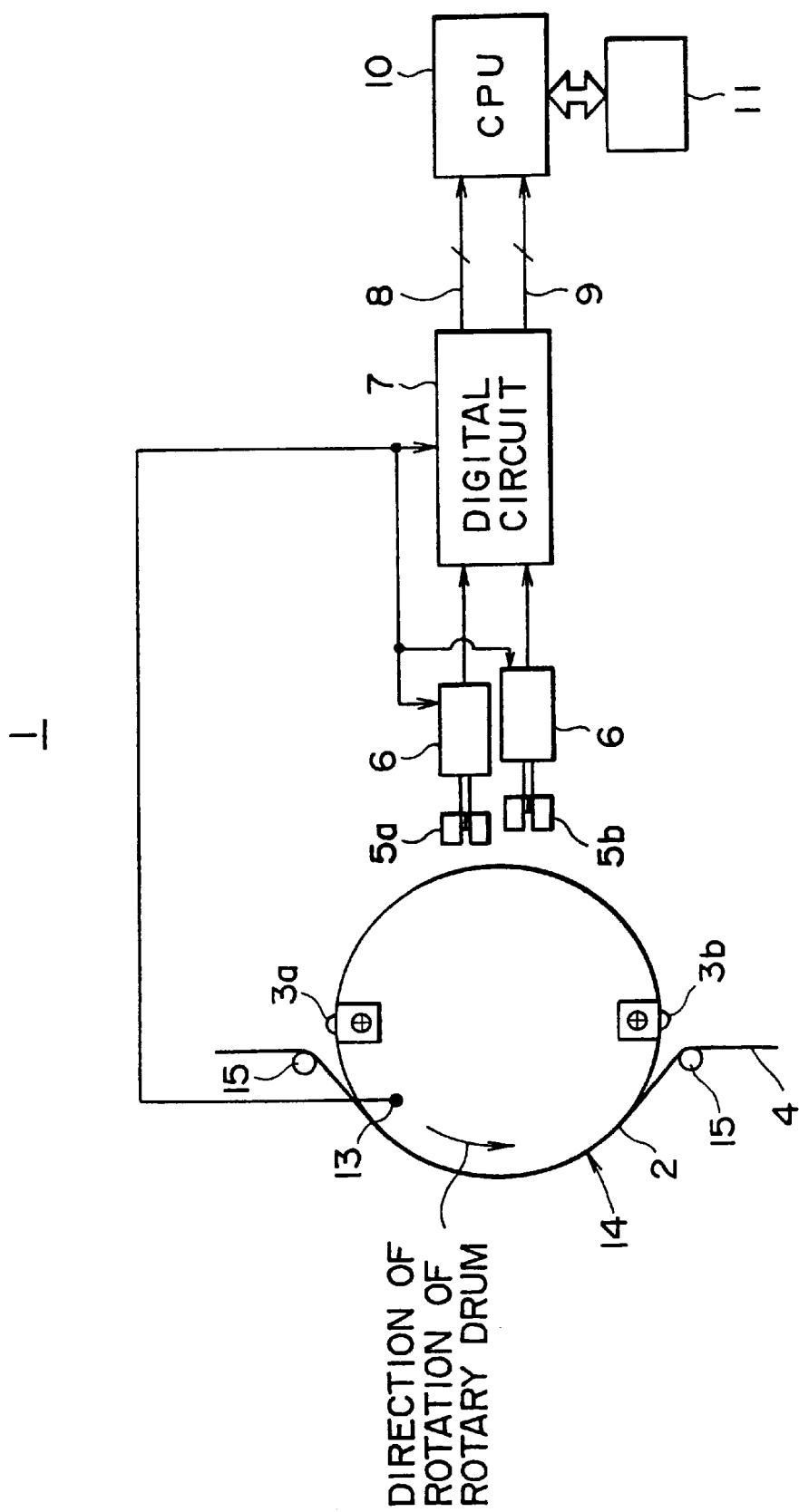
FIG. 1 is a schematic block diagram of a magnetic recording and/or reproduction apparatus to which the present invention is applied.

Referring first to FIG. 1, the magnetic recording and/or reproduction apparatus is schematically shown in block diagram and generally denoted at 1. The magnetic recording and/or reproduction apparatus 1 includes a first magnetic head 3a and a second magnetic head 3b mounted in an opposing relationship to each other at positions spaced from each other by an angular distance of 180 degrees on a rotary drum 2. A pulse generator (PG) 13 is mounted in the proximity of the first magnetic head 3a on the rotary drum 2. A first magnetic sensor 5a and a second magnetic sensor 5b for measuring the projection amounts of the first magnetic head 3a and the second magnetic head 3b are mounted at positions outside an angular range over which a magnetic tape 4 is wrapped around the rotary drum 2 and opposing to end portions of the first magnetic head 3a and the second magnetic head 3b such that the gaps to the end portions are different from each other. This arrangement of the first magnetic sensor 5a and second magnetic sensor 5b is employed in order to eliminate an otherwise possible influence of tolerances in shape or mounting errors of the first magnetic head 3a and the second magnetic head 3b upon measurement.

A pair of oscillation circuits 6 are individually connected to the first magnetic sensor 5a and the second magnetic sensor 5b. Address data and measurement data of the projection amounts of the first magnetic head 3a and the second magnetic head 3b are inputted from the oscillation circuits 6 to a digital circuit 7 using a reference signal of the pulse generator 13 as a trigger. Then, the measurement data of the projection amounts inputted to a CPU 10 by a data bus 8 of, for example, 10 bits while the address data are inputted to the CPU 10 by an address bus 9 of, for example, 12 bits.

Figure 2:
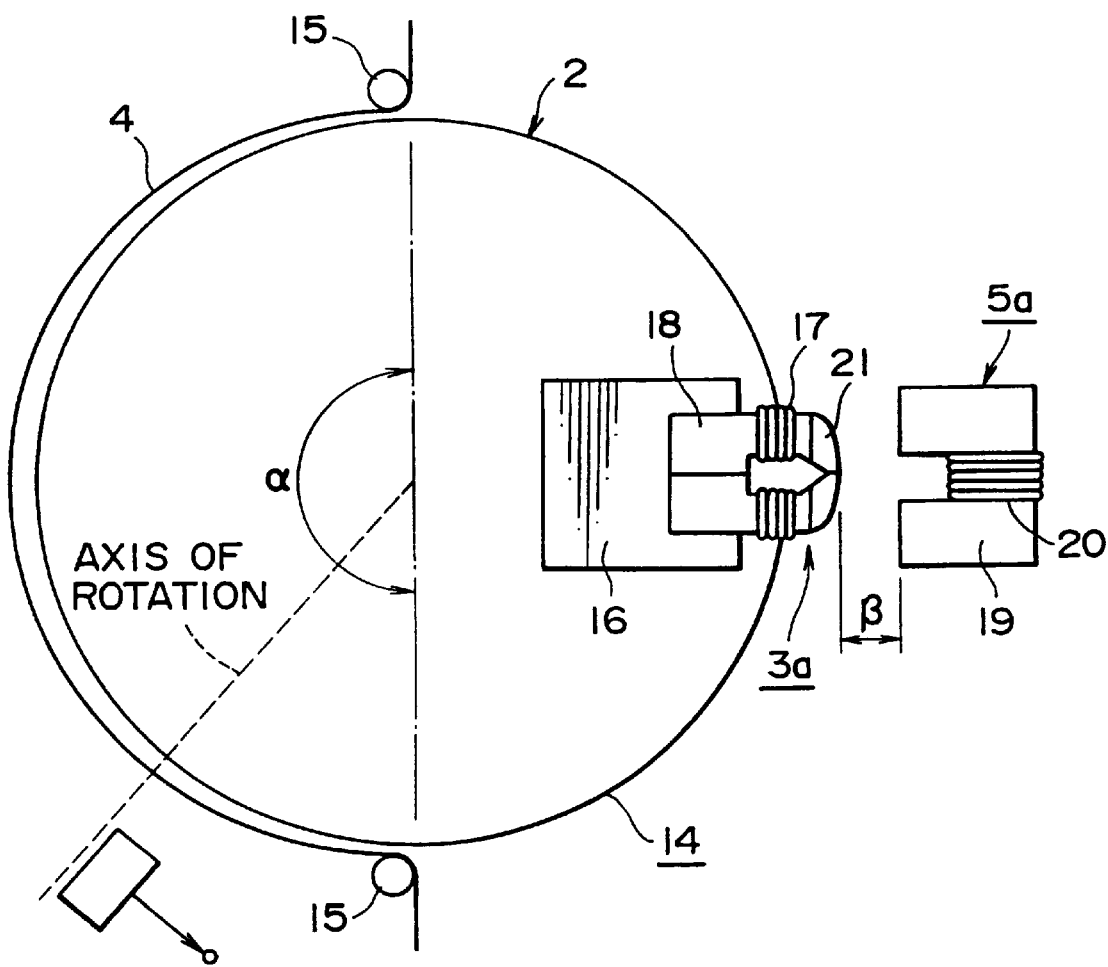
FIG. 2 is a schematic view illustrating a principle of measurement of a projection amount (abrasion amount) of a magnetic head by a magnetic sensor employed in the magnetic recording and/or reproduction apparatus of FIG. 1.

FIG. 2 illustrates the principle of measurement of the projection amount (abrasion amount) of a magnetic head according to the present invention. For convenience of illustration and description, an arrangement which includes a single magnetic head and a single magnetic sensor is described. In particular, referring to FIG. 2, in a rotary magnetic head apparatus 14 shown, a magnetic tape 4 is helically wrapped around a rotary drum 2 over a predetermined wrap angle $\alpha$ defined by a pair of guide pins 15, and information is recorded onto or reproduced from the magnetic tape 4 by a first magnetic head 3a (or 3b) mounted on the rotary drum 2.

A base 16 is mounted at a predetermined location of the rotary magnetic head apparatus 14, and the magnetic head 3a (or 3b) is fixedly mounted on the base 16. The magnetic head 3a (or 3b) is mounted in such a situation that it projects by a prescribed amount from an outer peripheral surface of the rotary drum 2. A pair of signal windings 17 are wound around both legs of a head core 18 of the magnetic head 3a (or 3b).

A magnetic sensor 5a (or 5b) is disposed in a spaced relationship by a predetermined gap $\beta$ from the drum surface of the rotary magnetic head apparatus 14, particularly from a head sliding surface 21 of the magnetic head 3a (or 3b) at a position outside the tape wrap angle $\alpha$, for example, where the wrap angle $\alpha$ is approximately 180 degrees as seen in FIG. 2, at a position spaced by 90 degrees from the tape wrap angle $\alpha$. The magnetic sensor 5a (or 5b) is formed from a channel-shaped core 19 and a detection coil 20 wound around the core 19. The detection coil 20 wound around the magnetic sensor 5a (or 5b) functions as part of an oscillation element of an oscillation circuit 6.

Since the magnetic head 3a (or 3b) is rotating, a situation wherein the magnetic head 3a (or 3b) is opposed to the magnetic sensor 5a (or 5b) and another situation wherein the magnetic head 3a (or 3b) is not opposed to the magnetic sensor 5a (or 5b) appear within one rotation of the magnetic head 3a (or 3b). In such a situation that the magnetic head 3a (or 3b) is opposed to the first magnetic sensor 5a (or 5b) as seen in FIG. 2, such a magnetic circuit as seen in FIG. 3 is formed from the magnetic head 3a (or 3b) and the magnetic sensor 5a (or 5b).

Figure 3:
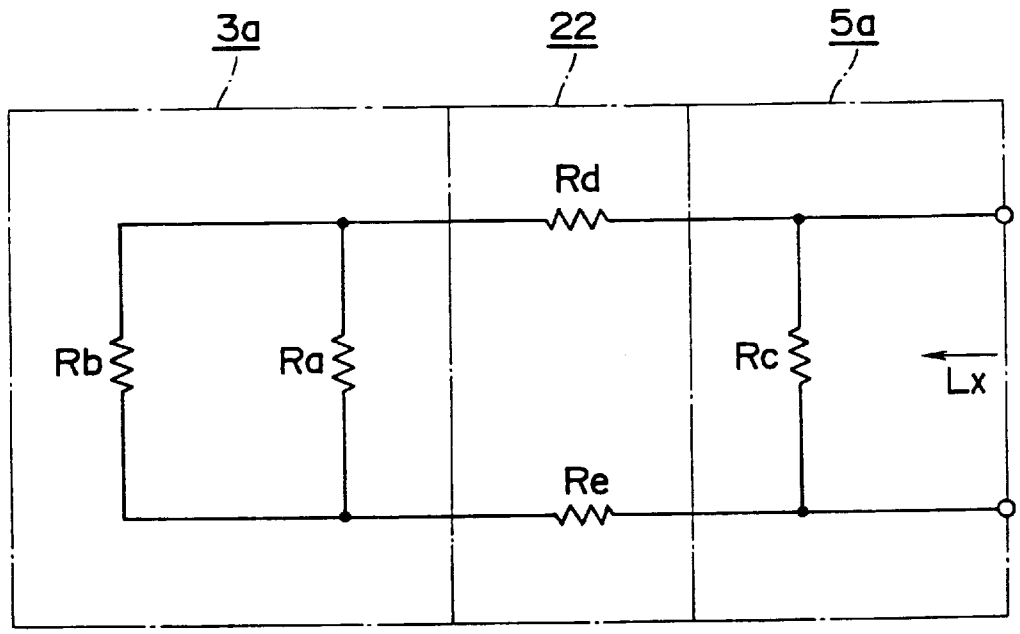
FIG. 3 is an equivalent magnetic circuit diagram including a magnetic gap of the magnetic recording and/or reproduction apparatus of FIG. 1.

In the equivalent circuit shown in FIG. 3, reference symbol Ra denotes the reluctance of the head sliding portion 21, and Rb the reluctance of the head core 18. Similarly, the reluctance of the detection coil 20 of the magnetic sensor 5a (or 5b) is denoted by Rc. Meanwhile, the reluctances at the magnetic gap 22 when the magnetic head 3a (or 3b) and the magnetic sensor 5a (or 5b) are opposed to each other are represented by Rd and Re. Here, the reluctances Rd and Re are reluctances between the two legs of the channel-shaped core 19 and the head sliding portion 21.

If the head sliding portion 21 is abraded, then the thickness of the head sliding portion 21 is reduced, and consequently, the reluctance Ra varies. Since also the opposing gap length between the head sliding portion 21 and the magnetic sensor 5a (or 5b) simultaneously varies, also the reluctances Rd and Re are varied by the variation. Accordingly, the value of the overall reluctance when the magnetic head 3a (or 3b) side is viewed from the magnetic sensor 5a (or 5b) is varied by the abrasion of the head.

Figure 4:
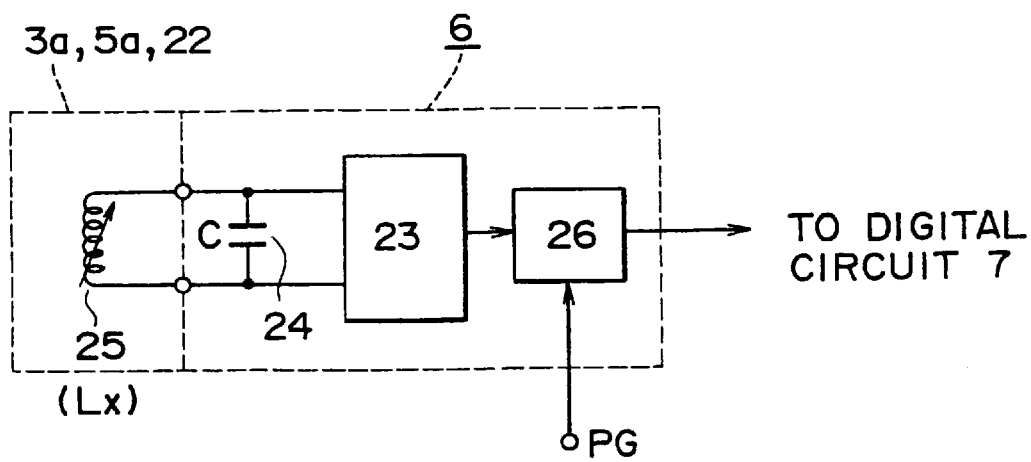
FIG. 4 is a circuit diagram showing a circuit system for measuring a magnetic head abrasion amount employed in the magnetic recording and/or reproduction apparatus of FIG. 1.

A variation of the inductance caused by the variation of the reluctance is supplied to the oscillation circuit 6. FIG. 4 shows an outline of a circuit system for measuring the projection amount (abrasion amount) of a magnetic head according to the present invention. Referring to FIG. 4, the oscillation circuit 6 shown includes an amplification unit 23 formed from a transistor or the like serving as an amplification element for oscillation. In the circuit shown in FIG. 4, LC elements are connected as an oscillation element on a parallel feedback path to the amplification unit 23. As the LC elements, a variable inductance element 25 is connected in parallel to a capacitor 24 which is a capacitive element. The variable inductance element 25 represents an overall inductance Lx illustrated in FIG. 3.

When the inductance Lx varies, the oscillation frequency of the oscillation element also varies, and the oscillation output is supplied to a measurement circuit 26, by which it is converted into a level (for example, a voltage level) which increases in proportion to the frequency. The oscillation frequency is counted using, for example, a counter, and converted into a voltage corresponding to the count value. The measurement data which increases in proportion to the oscillation frequency is supplied to the digital circuit 7 in the following stage.

Figure 5:
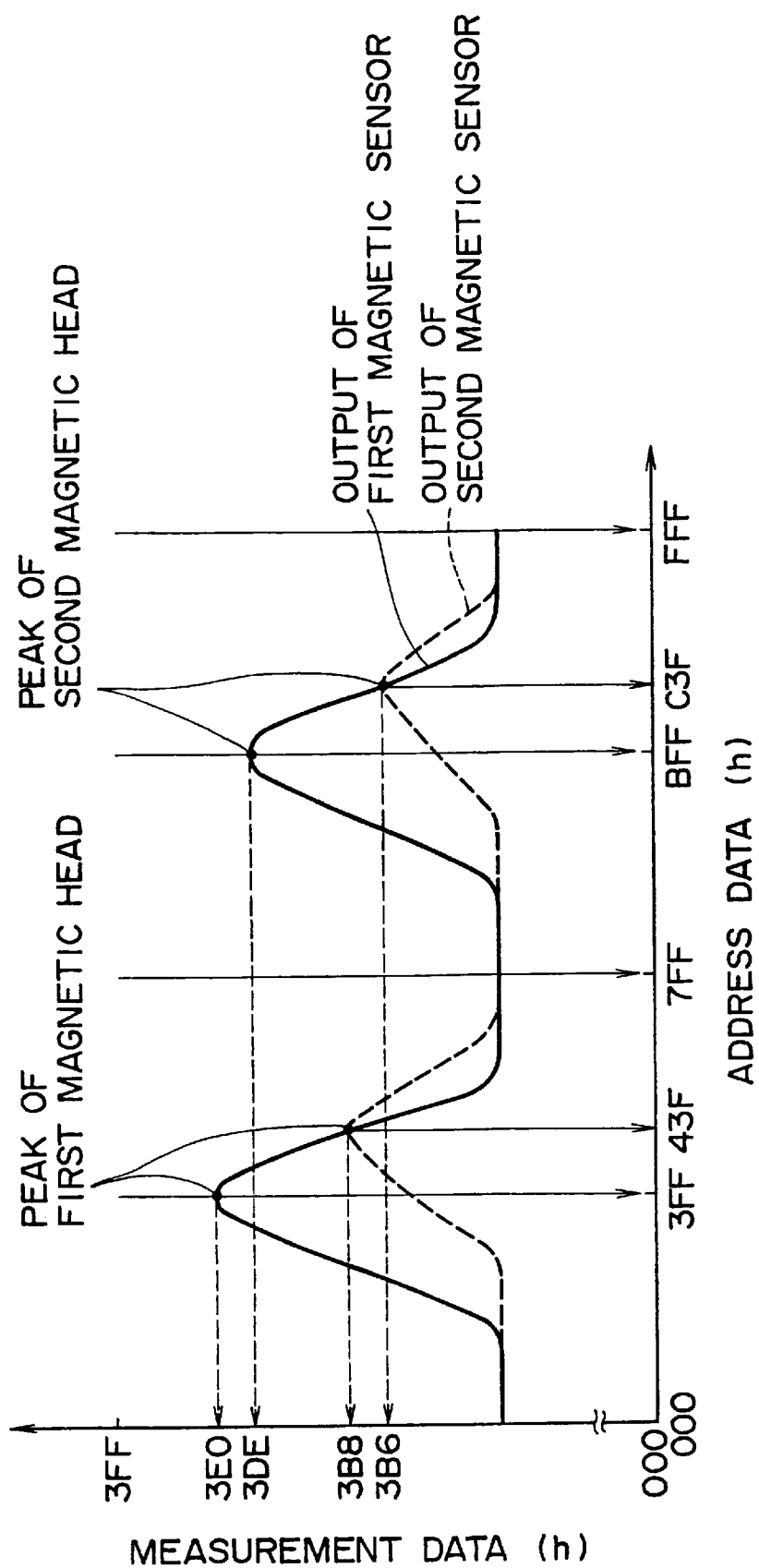
FIG. 5 is a schematic waveform diagram illustrating a relationship between address data and measurement data of a projection amount of a magnetic head of the magnetic recording and/or reproduction apparatus of FIG. 1.

FIG. 5 is a diagram illustrating a relationship between address data and measurement data of the projection amounts outputted from the first magnetic sensor 5a and the second magnetic sensor 5b. More particularly, FIG. 5 is a schematic waveform diagram illustrating the address data and the measurement data of the projection amounts after they are first processed by address data and measurement data re-arrangement 10a and peak search 10b by the CPU 10, which will be hereinafter described with reference to FIG. 6, and then are re-arranged in an order of the address data, whereafter they undergo peak search.

If it is assumed that the rotary drum 2 rotates in the counterclockwise direction as seen in FIG. 1, then the measurement data (indicated by a solid line in FIG. 5) of the projection amount outputted from the first magnetic sensor 5a exhibits two peaks at the address data 3FFh and BFFh, and the address data 3FFh represents the position of the first magnetic head 3a, and the BFFh represents the position of the second magnetic head 3b. Meanwhile, the measurement data (broken line) of the projection amount outputted from the second magnetic sensor 5b exhibits two peaks at the address data 43Fh and C3Fh, and the address data 43Fh represents the position of the first magnetic head 3a while the address data C3Fh represents the position of the second magnetic head 3b. The reason why the first magnetic head 3a and the second magnetic head 3b individually have two kinds of address data and different peaks from each other is that the first magnetic sensor 5a and the second magnetic sensor 5b are disposed in a spaced relationship by a predetermined distance from each other in the direction of rotation of the rotary drum 2 and the first magnetic sensor 5a and the second magnetic sensor 5b are disposed such that they have different gaps from each other from the first magnetic head 3a and the second magnetic head 3b.

Processing by the CPU 10 of the address data of the first magnetic head 3a and the second magnetic head 3b and the corresponding measurement data of projection amount initial values obtained in this manner is described below with reference to a flow chart of FIG. 6.

Measurement data 8a and address data 9a inputted to the CPU 10 are re-arranged in an order of the addresses of the address data 9a by address data and measurement data re-arrangement 10a. Thereafter, searching for peaks of the measurement data 8a corresponding to the address data 9a is performed by peak search 10b. Then, the address data 9a and peak values of the measurement data 8a corresponding to the address data 9a are stored as initial value data into a non-volatile memory 11 in the following manner. The initial value data are thereafter used as reference values in comparison and calculation of the variations of the projection amounts of the magnetic heads by the CPU 10.

First magnetic head 3a by first magnetic sensor 5a (address data, measurement data)=(3FFh, 3E0h)

Second magnetic head 3b by first magnetic sensor 5a (address data, measurement data)=(BFFh, 3DEh)

First magnetic head 3a by second magnetic sensor 5b (address data, measurement data)=(43Fh, 3B8h)

Second magnetic head 3b by second magnetic sensor 5b (address data, measurement data)=(C3Fh, 3B6h)

In the following, processing of the CPU 10 for calculating the abrasion amounts of the first magnetic head 3a and the second magnetic head 3b by comparison with the initial value data is described.

After measurement of the projection amounts of the first magnetic head 3a and the second magnetic head 3b is started, measurement data 8a' are inputted from the data bus 8 and the address data 9a' are inputted from the address bus 9, to the CPU 10. Also, the address data 9a and the measurement data 8a of the initial values of the first magnetic head 3a and the second magnetic head 3b stored in the non-volatile memory 11 are inputted to the CPU 10. Then, only when the address data 9a' and the address data 9a coincide with each other, measurement data 8b are outputted by address decoding 10c, and they are compared by comparison 10d. By calculating the differences between the projection amounts by the comparison 10d, the variations (abrasions) of the projection amounts of the first magnetic head 3a and the second magnetic head 3b are measured.

While, in the apparatus described above, one peak measurement data is stored for one address data into the non-volatile memory 11, where the radius of curvature at an end of a magnetic head is large or data are not smooth on the level of the measurement resolution, it is difficult to obtain measurement data of a peak. A countermeasure to discriminate a peak in such an instance is described below with reference to FIGS. 7A and 7B.

Figure 7A:
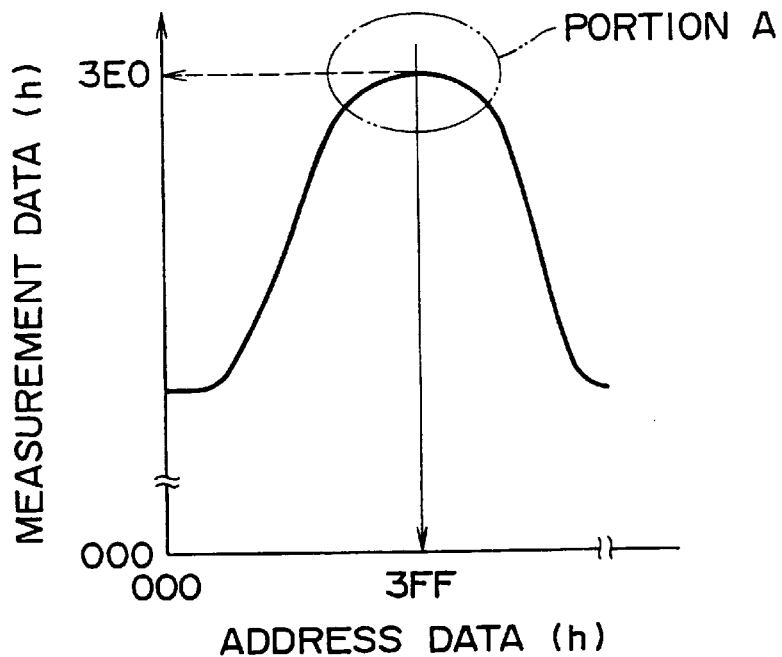
FIG. 7A is a schematic waveform diagram illustrating a relationship between address data and measurement data of the projection amount of a magnetic head of the magnetic recording and/or reproduction apparatus of FIG. 1
Figure 7B:
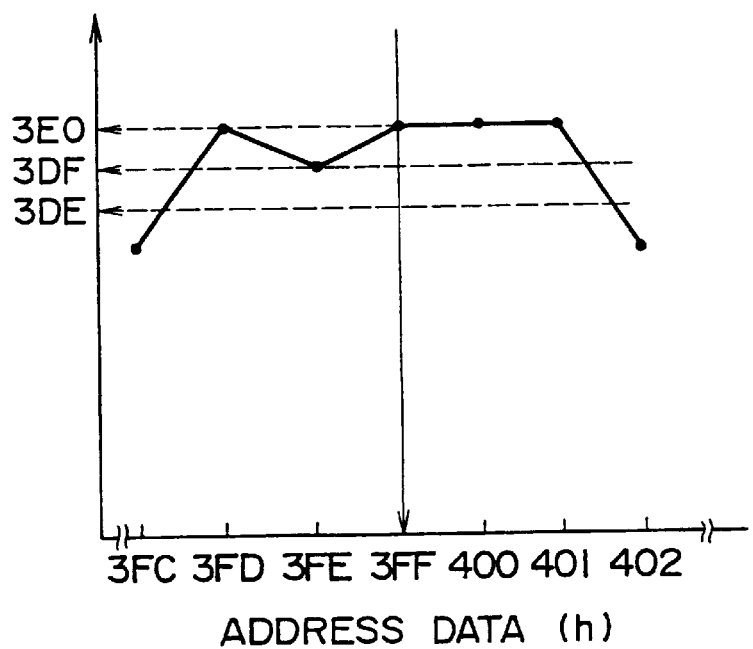
FIG. 7B is a schematic enlarged view of a portion A in FIG. 7A.

FIG. 7A is a schematic waveform diagram illustrating a relationship between address data and measurement data of a projection amount outputted from the first magnetic sensor 5a similarly to FIG. 5, and FIG. 7B is a schematic enlarged view of a portion A of FIG. 7A.

In such an instance as illustrated in FIGS. 7A and 7B, there is no problem in terms of the accuracy in measurement if address data 3FFh is discriminated as a peak and an average value of address data on the opposite sides of the address data 3FFh such as, for example, the address data 3FDh, 3FEh, 3FFh, 400h and 401h is determined as measurement data of the projection amount corresponding to the address data 3FFh.

While, in the apparatus described hereinabove, two magnetic heads of the first magnetic head 3a and the second magnetic head 3b are disposed on the rotary drum 2, the present invention is not limited to the specific arrangement and can be applied also to another arrangement wherein a single magnetic head or more than two magnetic heads are disposed on the rotary drum 2. Further, while both address data and measurement data of the projection amounts outputted from the first magnetic sensor 5a and the second magnetic sensor 5b are stored into the non-volatile memory 11, in order to further reduce the capacity of the non-volatile memory 11, the address data 9a' of the first magnetic head 3a and the second magnetic head 3b by the second magnetic sensor 5b may not be stored. This is possible because of the fact that the relative position of the second magnetic sensor 5b to the first magnetic sensor 5a is fixed and, while measurement by the second magnetic sensor 5b is required in order to obtain the address data 9a and the measurement data 8a of the initial values of the first magnetic head 3a and the second magnetic head 3b, the address data 9a are not necessarily required after the initial values are measured.

Having now fully described the invention, it will be apparent to one of ordinary skill in the art that many changes and modifications can be made thereto without departing from the spirit and scope of the invention as set forth herein in the following claims.

What is claimed is:

1. A magnetic recording and/or reproduction apparatus, comprising:

measurement means disposed in an opposing and non-contacting relationship to a rotary magnetic head apparatus, on which a magnetic head is mounted, outside a range of a wrap angle over which a magnetic tape is wrapped around a rotary drum of said rotary magnetic head apparatus for measuring a rotational position of said magnetic head and for measuring a projection amount of said magnetic head from said rotary drum at said rotational position of said magnetic head;

a digital circuit for converting the measured rotational position and the measured projection amount from said measurement means into digital data in response to a reference signal generated for each rotation of said rotary drum;

a memory for storing initial values of the rotational position and the projection amount in the form of digital data obtained by the conversion of said digital circuit; and a central processing unit (CPU) for comparing the initial values of the rotational position and the projection amount stored in said memory with the rotational position and the projection amount measured by said measurement means, respectively;

said CPU comparing the projection amount measured by said measurement means with the projection amount stored in said memory only when the rotational position measured by said measurement means and the initial value of the rotational position stored in said memory are equal to each other.

2. The magnetic recording and/or reproduction apparatus according to claim 1, wherein said rotary magnetic head apparatus includes two magnetic heads.

3. The magnetic recording and/or reproduction apparatus according to claim 2, wherein a plurality of said initial values of the rotational position are stored in said memory and a plurality of projection amounts are measured by said measurement means only when one of the plurality of initial positions of the rotary position and the rotational position measured by said measurement means are equal to each other, and said CPU calculates an average value of the plurality of projection amounts and compares the average value with the initial value of the projection amount stored in said memory.

4. The magnetic recording and/or reproduction apparatus according to claim 2, wherein said measurement means includes a plurality of magnetic sensors disposed such that end portions thereof are positioned at different respective distances from each other and from said magnetic head.

5. The magnetic recording and/or reproduction apparatus according to claim 4, wherein an abrasion amount of said magnetic head is calculated by said CPU based on a variation between oscillation frequencies at positions at which said magnetic head and said magnetic sensors are opposed to each other.

6. A magnetic recording and/or reproduction apparatus, comprising:

measurement means disposed in an opposing and non-contacting relationship to a rotary magnetic head apparatus, on which at least one magnetic head is mounted, outside a range of a wrap angle over which a magnetic tape is wrapped around a rotary drum of said rotary magnetic head apparatus for measuring a rotational position of said magnetic head and for measuring a projection amount of said magnetic head from said rotary drum at said rotational position of said magnetic head from a variation in oscillation frequency of an oscillator included in said measurement means;

a digital circuit for converting the measured rotational position and the measured projection amount from said measurement means into digital data in response to a reference signal generated for each rotation of said rotary drum;

a memory for storing initial values of the rotational position and the projection amount in the form of digital data obtained by the conversion of said digital circuit; and a central processing unit (CPU) for comparing the initial values of the rotational position and the projection amount stored in said memory with the rotational position and the projection amount measured by said measurement means, respectively, said CPU comparing the projection amount measured by said measurement means with the projection amount stored in said memory only when the rotational position measured by said measurement means and the initial value of the rotational position stored in said memory are equal to each other.

* * * * *